US007800459B2

(12) United States Patent
Hall et al.

(10) Patent No.: US 7,800,459 B2
(45) Date of Patent: Sep. 21, 2010

(54) ULTRA-HIGH BANDWIDTH INTERCONNECT FOR DATA TRANSMISSION

(75) Inventors: Stephen H. Hall, Forest Grove, OR (US); Michael T. White, North Plains, OR (US); Howard Heck, Hillsboro, OR (US); Bryce D. Horine, Portland, OR (US)

(73) Assignee: Intel Corporation, Santa Clara, CA (US)

(*) Notice: Subject to any disclaimer, the term of this patent is extended or adjusted under 35 U.S.C. 154(b) by 488 days.

(21) Appl. No.: 11/647,842

(22) Filed: Dec. 29, 2006

(65) Prior Publication Data

US 2008/0157903 A1 Jul. 3, 2008

(51) Int. Cl.
*H01P 3/00* (2006.01)
*H01P 5/08* (2006.01)
*H03H 17/00* (2006.01)

(52) U.S. Cl. ........................ 333/24 R; 333/27; 333/248

(58) Field of Classification Search ............... 333/24 R, 333/27, 113, 116, 122, 135, 137, 239, 248; 385/1
See application file for complete search history.

(56) References Cited

U.S. PATENT DOCUMENTS 5,355,422 A * 10/1994 Sullivan et al. ................ 385/1
5,987,315 A * 11/1999 Nishida ...................... 455/327
6,072,699 A 6/2000 Horine
6,144,576 A 11/2000 Leddige et al.
6,175,239 B1 1/2001 Hall
6,249,142 B1 6/2001 Hall et al.
6,346,842 B1 2/2002 Hall, Jr. et al.
6,353,539 B1 3/2002 Horine et al.
6,362,973 B1 3/2002 Leddige et al.
6,366,466 B1 4/2002 Leddige et al.
6,429,383 B1 8/2002 Sprietsma et al.
6,477,614 B1 11/2002 Leddige et al.
6,587,912 B2 7/2003 Leddige et al.
6,642,158 B1 11/2003 Brist et al.
6,672,902 B2 1/2004 Skinner et al.
6,674,648 B2 1/2004 McCall et al.
6,737,883 B2 5/2004 Hall
6,747,216 B2 6/2004 Brist et al.
6,788,222 B2 9/2004 Hall et al.
6,803,527 B2 10/2004 Dishongh et al.
6,882,762 B2 4/2005 Brist et al.
6,891,899 B2 5/2005 Hall et al.
6,916,183 B2 7/2005 Alger et al.
6,931,246 B2 * 8/2005 Iwatani et al. ............... 455/326
6,992,899 B2 1/2006 Alger et al.
7,020,792 B2 3/2006 Hall
7,022,919 B2 4/2006 Brist et al.
7,043,097 B2 * 5/2006 Coldren et al. ................. 385/1
7,043,706 B2 5/2006 Brist et al.

(Continued)

OTHER PUBLICATIONS

S. Kodama et al., 320 Gbit/s optical gate monolithically integrating photodiode and electroabsorption modulator, Feb. 2003, Electronic Letters, vol. 39 No. 4, 383, 384.*

(Continued)

*Primary Examiner*—Dean O Takaoka
(74) *Attorney, Agent, or Firm*—Robert D. Anderson

(57) ABSTRACT

In some embodiments an interconnect includes a waveguide and a transmission line coupled in parallel with the waveguide. Other embodiments are described and claimed.

34 Claims, 5 Drawing Sheets

U.S. PATENT DOCUMENTS

| | | | |
|---|---|---|---|
| 7,064,063 | B2 | 6/2006 | Brist et al. |
| 7,121,841 | B2 | 10/2006 | Alger et al. |
| 7,145,243 | B2 | 12/2006 | Brist et al. |
| 7,257,283 | B1 * | 8/2007 | Liu et al. ...................... 385/14 |
| 7,317,846 | B2 * | 1/2008 | Keil .............................. 385/3 |
| 7,340,121 | B2 * | 3/2008 | Yonekura et al. .............. 385/14 |
| 2003/0117786 | A1 | 6/2003 | Chang et al. |
| 2005/0063637 | A1 | 3/2005 | Mershon et al. |
| 2005/0063638 | A1 | 3/2005 | Alger et al. |
| 2005/0208749 | A1 | 9/2005 | Beckman et al. |
| 2005/0221066 | A1 | 10/2005 | Brist et al. |
| 2006/0123371 | A1 | 6/2006 | Brist et al. |
| 2006/0148281 | A1 | 7/2006 | Horine et al. |
| 2006/0258184 | A1 | 11/2006 | Alger et al. |
| 2007/0000687 | A1 | 1/2007 | Brist et al. |
| 2007/0001789 | A1 | 1/2007 | Suarez-Gartner et al. |
| 2007/0001907 | A1 | 1/2007 | Hall et al. |
| 2007/0037432 | A1 | 2/2007 | Mershon et al. |
| 2008/0069359 | A1 * | 3/2008 | Mouli ........................ 380/259 |

OTHER PUBLICATIONS

Intel Corp., U.S. Appl. No. 11/322,488; Brisk et al.; filed Dec. 30, 2005.
Intel Corp., U.S. Appl. No. 11/319,875; Hall et al.; filed Dec. 27, 2005.
Intel Corp., U.S. Appl. No. 11/322,964; Horine et al.; filed Dec. 30, 2005.
Intel Corp., U.S. Appl. No. 11/322,995; Horine et al.; filed Dec. 30, 2005.
Intel Corp., U.S. Appl. No. 10/409,890; Sato et al.; filed Apr. 8, 2003.
Intel Corp., U.S. Appl. No. 11/468,244; Alger et al.; filed Aug. 29, 2006.
Intel Corp., U.S. Appl. No. 11/282,874; Alger et al.; filed Nov. 17, 2005.
Intel Corp., U.S. Appl. No. 11/322,601; Brisk et al.; filed Dec. 30, 2005.
Intel Corp., U.S. Appl. No. 11/393,329; Heck et al.; filed Mar. 30, 2006.
Intel Corp., U.S. Appl. No. 11/385,093; Liang et al.; filed Mar. 21, 2006.

* cited by examiner

ULTRA-HIGH BANDWIDTH INTERCONNECT FOR DATA TRANSMISSION

TECHNICAL FIELD

The inventions generally relate to an ultra-high bandwidth interconnect for data transmission.

BACKGROUND

Current methods of transmitting digital data between components on a motherboard (for example, between a chipset and a processor) use transmission lines. As data rates increase in proportion to Moore's Law, signals propagating on the transmission line are dramatically attenuated due to the low-pass filter behavior of the transmission line structure.

FIG. 1 illustrates a graph 100 depicting the behavior of a traditional transmission line. As evident in FIG. 1, it is noted that high frequencies are attenuated, which causes a large roadblock to designing high speed digital systems. An interconnect with the behavior illustrated in FIG. 1 allows data transmission up to approximately 20 Gb/sec (gigabits per second), with a fundamental frequency of approximately 10 GHz (gigahertz). Above this data rate the harmonic components of the digital waveform would be so attenuated that the signal is not recoverable at the receiver end of the transmission line. For example, at 20 Gb/sec (10 GHz fundamental frequency), the signal is attenuated to approximately −20 dB (decibels) (approximately 10% of the original signal), and at 40 Gb/sec (20 GHz fundamental frequency), the signal is attenuated to approximately −30 dB (decibels) (approximately 3% of the original signal). Signals attenuated at this level are not typically recoverable at the receiver. Therefore, as data rates have increased, a need has arisen for an ultra-high bandwidth, low loss, cost effective interconnect that can be used to transmit digital data between components on a digital system (for example, on a printed circuit board such as a motherboard).

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to an ultra high bandwidth interconnect for data transmission.

Some embodiments of the inventions relate to an interconnect that includes a waveguide and a transmission line coupled in parallel with the waveguide.

Some embodiments of the inventions relate to a system including a first component, a second component, and an interconnect that includes a waveguide and a transmission line coupled in parallel with the waveguide.

Figure 1:
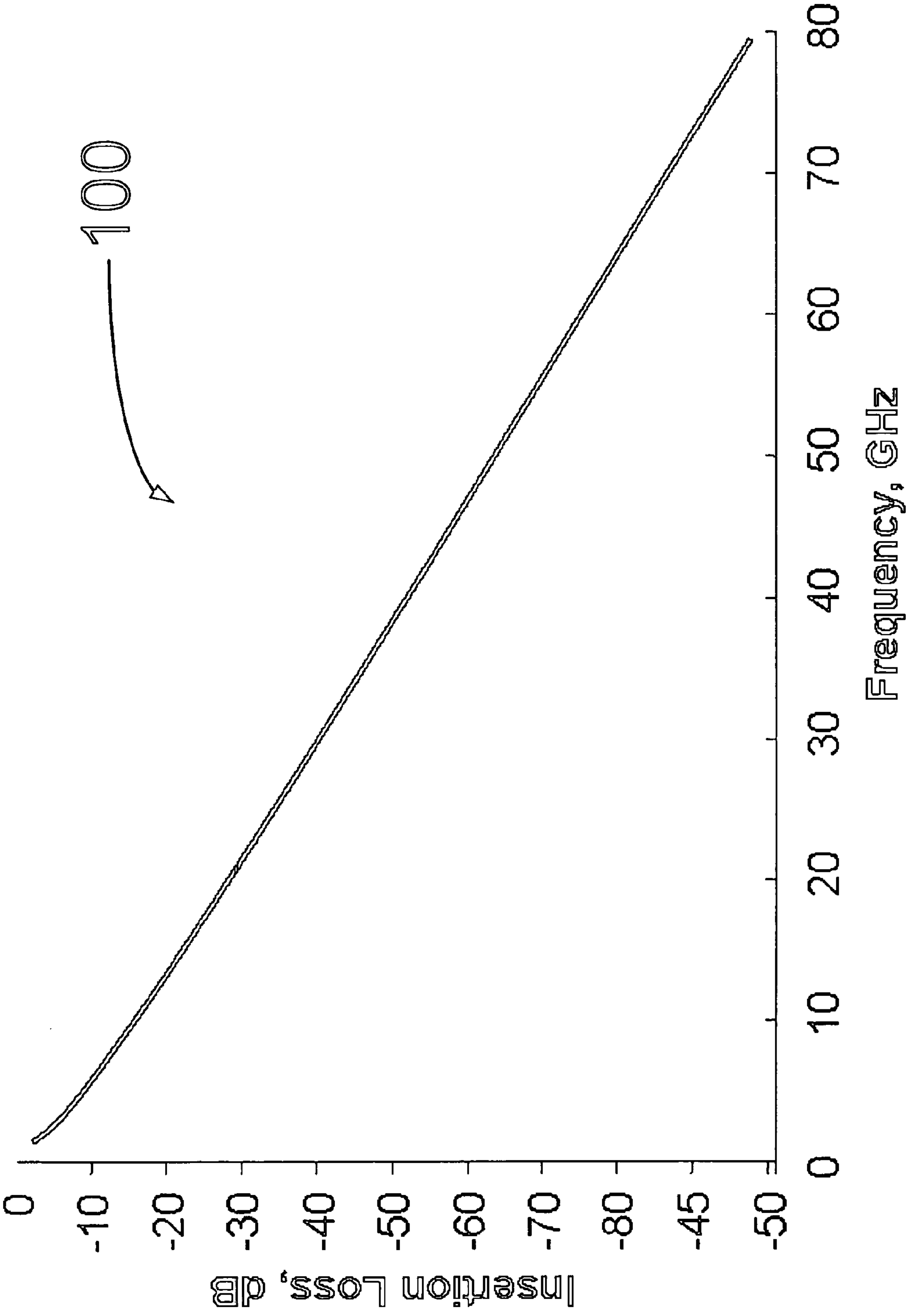
FIG. 1 illustrates a graph according to some embodiments of the inventions.
Figure 2:
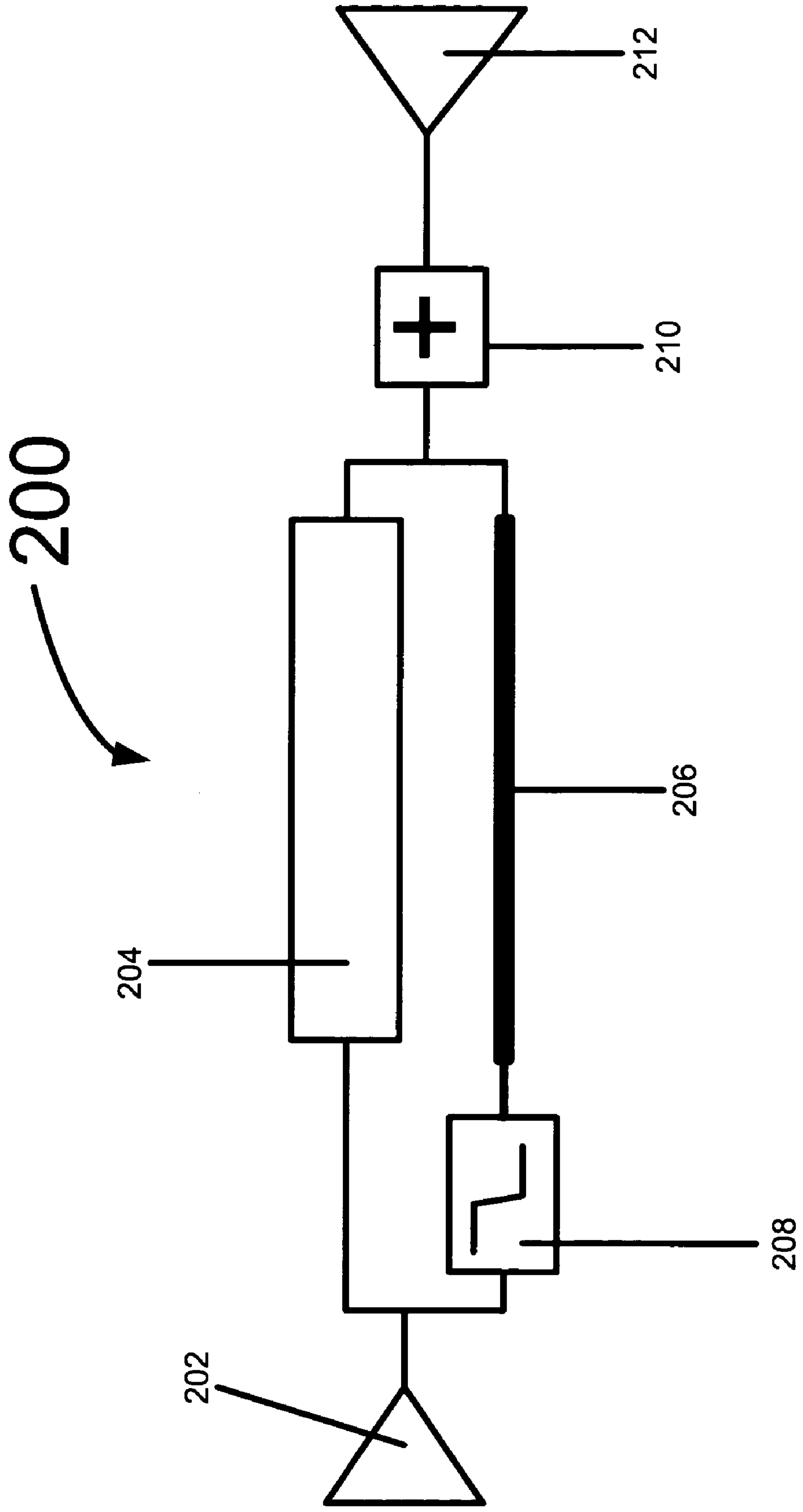
FIG. 2 illustrates an apparatus according to some embodiments of the inventions.

FIG. 2 illustrates an apparatus 200 according to some embodiments. In some embodiments apparatus 200 includes a driver 202, a waveguide 204, a transmission line 206, a low pass filter 208, an adder 210, and a receiver 212. The transmission line 206 is arranged in parallel with the waveguide 204. A transmission line is typically a low pass device it is very efficient at transmitting data below a certain frequency. Conversely, a waveguide is typically a high pass device that is very efficient at transmitting data above a certain frequency. Therefore, when the waveguide 204 and the transmission line 206 are placed in parallel with each other the waveguide will propagate high frequency data and the transmission line will propagate low frequency data. The parallel combination of waveguide 204 and transmission line 206 dramatically increases the total bandwidth available for transmitting digital data. In some embodiments, waveguide 204 is a rectangular waveguide, a substrate integrated waveguide, an electromagnetic bandgap waveguide, a folded waveguide, a circular waveguide, and/or any other type of waveguide. In some embodiments, transmission line 206 is a microstrip transmission line, a stripline transmission line, and/or any other type of transmission line.

Although a transmission line is a natural low pass filter, it is not very efficient and does not have a sharp cut-off. Therefore, in some embodiments, in order to preserve a linear phase relationship of the parallel structure of waveguide 204 and transmission line 206, low pass filter 208 is placed in series with the transmission line 206 to ensure a minimal phase interaction between the transmission line 206 and the waveguide 204. In some embodiments a filter is not provided in series with the waveguide 204 because a waveguide is naturally an efficient high pass filter. In some embodiments, a linear phase response of the entire structure also requires that the propagation delay of the waveguide and the transmission line be equal, which can be achieved by choosing appropriate dielectric constants, manipulating lengths, and/or adding delay circuitry.

In some embodiments driver 202 drives the signal to be transmitted. Higher frequency signals are then transmitted via waveguide 204 and lower frequency signals are transmitted via the serial connection of low pass filter 208 and transmission line 206. In some embodiments, the signal then passes through an adder 210 and is provided to receiver 212.

In some embodiments the parallel coupling of the waveguide 204 and the transmission line 206 (with or without the low pass filter 208 included) is an interconnect. In some embodiments the interconnect including the parallel arrangement of the waveguide 204 and the transmission line 206 (with or without the low pass filter 208) is a high speed bus, a graphics bus, a memory bus, a front side bus, an interconnect between two components on a board, an interconnect between a processor and a chip set, an interconnect in any digital system, an interconnect in a computer, an interconnect in a desktop computer, an interconnect in a laptop computer, an interconnect in a server, an interconnect on a printed circuit board, and/or an interconnect on a motherboard, for example.

Figure 3:
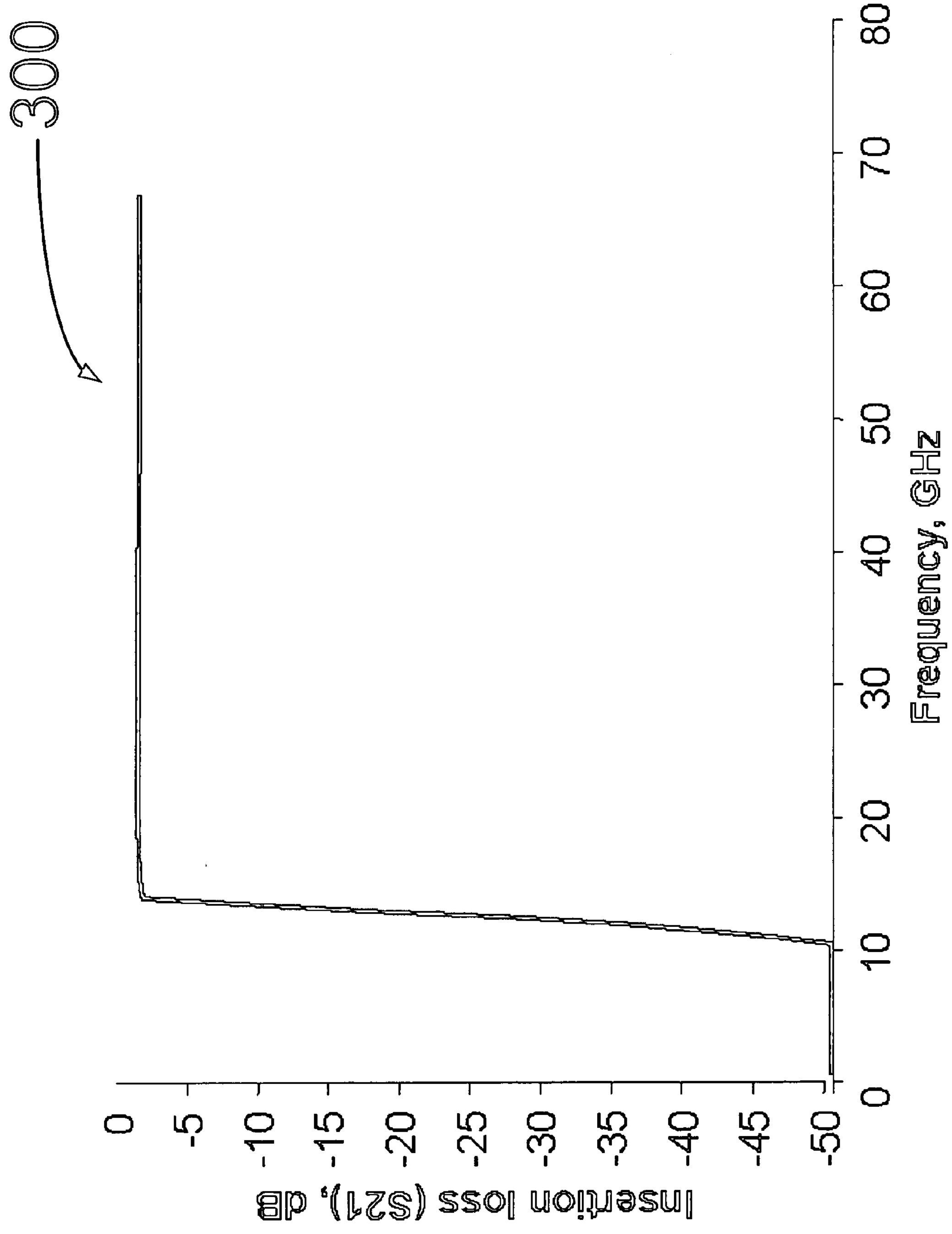
FIG. 3 illustrates a graph according to some embodiments of the inventions.

FIG. 3 illustrates a graph 300 according to some embodiments. Graph 300 shows insertion loss in decibels (dB) on the vertical axis and frequency in gigahertz (GHz) on the horizontal axis. Graph 300 illustrates an exemplary response of a printed circuit board (PCB) substrate integrated waveguide (for example, using 10 inch Rogers 5880 material). The response at high frequencies above approximately 10 GHz or higher is very good, while the response at lower frequencies of below approximately 10 GHz is very poor, since the cutoff frequency of the waveguide is at 10 GHz, which is when it starts propagating.

Figure 4:
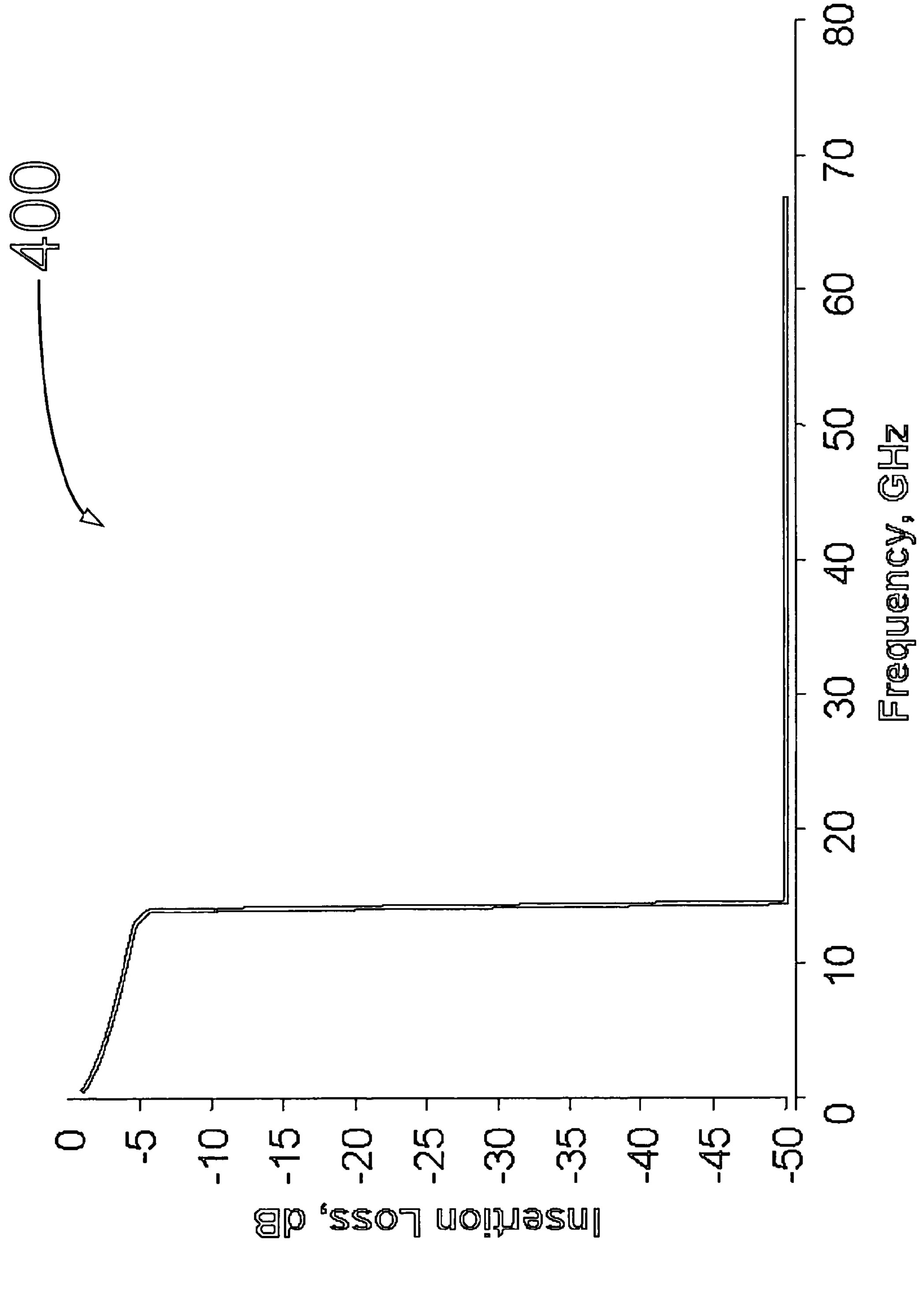
FIG. 4 illustrates a graph according to some embodiments of the inventions.

FIG. 4 illustrates a graph 400 according to some embodiments. Graph 400 shows insertion loss in decibels (dB) on the vertical axis and frequency in gigahertz (GHz) on the horizontal axis. Graph 400 illustrates an exemplary response of low pass filter connected in series with a transmission line (for example, using 10 inch Rogers 5880 substrate material). The response at high frequencies below approximately 10 GHz (or approximately 12 GHz in a case where the filter frequency is a little higher than the waveguide cutoff frequency) is very good, while the response at higher frequencies of approximately 10 GHz (or approximately 12 GHz) or higher is very poor.

Figure 5:
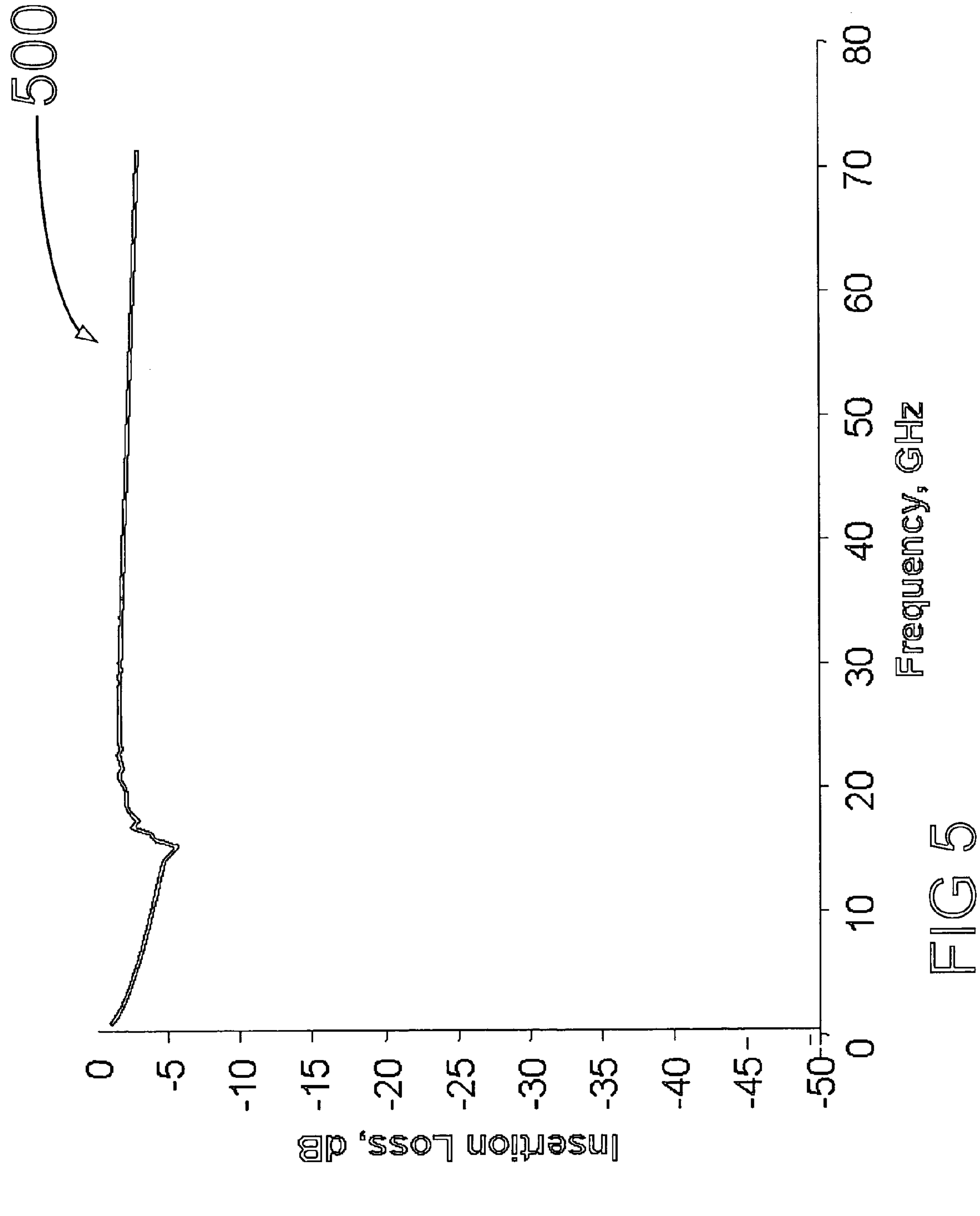
FIG. 5 illustrates a graph according to some embodiments of the inventions.

FIG. 5 illustrates a graph 500 according to some embodiments. Graph 500 shows insertion loss in decibels (dB) on the vertical axis and frequency in gigahertz (GHz) on the horizontal axis. Graph 500 illustrates an exemplary response of a waveguide such as a printed circuit board (PCB) substrate integrated waveguide (for example, using 10 inch Rogers 5880 material) connected in parallel with an arrangement of a low pass filter connected in series with a transmission line (for example, using 10 inch Rogers 5880 material). The response illustrated in FIG. 5 shows a relatively flat, very wide band behavior. FIG. 5 further illustrates the point that a waveguide and a transmission line arranged in parallel with each other (for example, as in the embodiments illustrated in FIG. 2) allow the transmission line to propagate low frequency data and the waveguide to propagate high frequency data. The parallel combination dramatically increases the bandwidth available for transmitting digital data.

The table shown below illustrates transmitted energy (that is the percent of original signal left after attenuation) between a conventional FR4 transmission line (T.L.) channel and a parallel waveguide/transmission line channel (for example, constructed with Rogers 5880 10 inch material). As evident from the table below, significantly more bandwidth is available from the parallel waveguide/transmission line arrangement than with conventional transmission lines. In some embodiments, the parallel arrangement allows, for example, conventional binary signaling to be extended to data rates of at least five times beyond what is possible with conventional transmission lines. As evident from the table below, conventional transmission line channels begin to be impractical at approximately 20 Gb/sec because the signal is attenuated to 10% of its initial value due to the low pass nature of transmission lines. A parallel arrangement of a waveguide and a transmission line (for example, according to some embodiments) allows signal transmission using binary signaling from DC (direct current) up to 100 Gb/sec, and possibly even at higher frequencies. In some embodiments, the numbers on the far right of the table actually get better as the data rate increases. For example, the 20 GB/sec case propagates most of its energy on the transmission line. The 30 Gb/sec case has most of its energy on the blip at 15 GHz in FIG. 5, for example, and the other data rates propagate most of the energy on the waveguide, which is more flat with frequency.

| Data rate | Conventional T.L. | Parallel waveguide/T.L. |
|---|---|---|
| 20 Gb/sec | −20 dB/10% | −5 dB/56% |
| 30 Gb/sec | −25 dB/5.6% | −6 dB/50% |
| 40 Gb/sec | −30 dB/3.2% | −3 dB/70% |
| 50 Gb/sec | −35 dB/1.8% | −3 dB/70% |
| 100 Gb/sec | −60 dB/0.1% | −3 dB/70% |

In some embodiments an ultra high bandwidth, low loss, cost effective interconnect may be used to transmit data between components on a digital system (for example, a printed circuit board such as a motherboard and/or between components on the board such as a processor and a chip set). This arrangement allows for an increase in useable bandwidth of many times as compared with conventional transmission lines.

In some embodiments two orthogonal energy propagation schemes (a waveguide and a transmission line) are combined into a single wide band low loss channel.

In some embodiments an interconnect allows serial data transmission.

In some embodiments one of the primary speed limiters that is currently providing a roadblock to platforms scaling with Moore's Law is removed. The low pass nature of transmission lines is combined with the high pass nature of a waveguide to allow for very high data rates of transmission. Since both low frequency and high frequency data transmission is supported, traditional binary signaling may be used. While traditional signaling using transmission lines runs out of gas at approximately 20 Gb/sec and traditional waveguides do not support transmission of frequencies below their cutoff frequency, a parallel arrangement of a waveguide and a transmission line according to some embodiments allows the potential of scaling bus speed to 100 Gb/sec and higher.

In some embodiments, an interconnect is capable of signal transmission at data rates from direct current up to at least 100 Gb/sec or higher. In some embodiments, an interconnect is capable of signal transmission using binary signaling, frequency modulation, phase modulation, amplitude modulation, quadrature modulation, and/or some other type of signal transmission.

Although some embodiments have been described herein, according to some embodiments these particular implementations may not be required. Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An interconnect comprising:

a transmission line;

a waveguide coupled in parallel with the transmission line; and an adder to combine signals transmitted over the waveguide and signals transmitted over the transmission line.

2. The interconnect of claim 1, further comprising a low pass filter coupled in serial with the transmission line, wherein the serial coupling of the low pass filter and the transmission line is coupled in parallel with the waveguide.

3. The interconnect of claim 1, wherein the interconnect is one or more of a high speed bus, a memory bus, a graphics bus, a front side bus, an interconnect between two components on a board, an interconnect between a processor and a chip set, an interconnect in a digital system, an interconnect in a computer, an interconnect in a desktop computer, an interconnect in a laptop computer, an interconnect in a server, an interconnect on a printed circuit board, or an interconnect on a motherboard.

4. The interconnect of claim 1, wherein a driver is to provide a signal to be transmitted over the interconnect and a receiver is to receive the signal to be transmitted over the interconnect.

5. The interconnect of claim 1, wherein the interconnect is capable of signal transmission using at least one of binary signaling, frequency modulation, phase modulation, amplitude modulation, or quadrature modulation.

6. The interconnect of claim 1, wherein the interconnect is capable of signal transmission at data rates from direct current up to at least 100 Gb/sec.

7. A system comprising:

a first component;

a second component; and an interconnect comprising:

a transmission line;

a waveguide coupled in parallel with the transmission line; and a low pass filter coupled in serial with the transmission line, wherein the serial coupling of the low pass filter and the transmission line is coupled in parallel with the waveguide.

8. The system of claim 7, wherein the interconnect is capable of signal transmission at data rates from direct current up to at least 100 Gb/sec.

9. The system of claim 7, the interconnect further comprising an adder to combine signals transmitted over the waveguide and signals transmitted over the transmission line.

10. The system of claim 7, wherein the interconnect is one or more of a high speed bus, a memory bus, a graphics bus, a front side bus, an interconnect between two components on a board, an interconnect between a processor and a chip set, an interconnect in a digital system, an interconnect in a computer, an interconnect in a desktop computer, an interconnect in a laptop computer, an interconnect in a server, an interconnect on a printed circuit board, or an interconnect on a motherboard.

11. The system of claim 7, further comprising a driver to provide a signal to be transmitted over the interconnect and a receiver to receive the signal to be transmitted over the interconnect.

12. The system of claim 7, wherein the first component is a processor and the second component is at least one integrated circuit of a chip set.

13. The system of claim 7, wherein the interconnect is capable of signal transmission using at least one of binary signaling, frequency modulation, phase modulation, amplitude modulation, or quadrature modulation.

14. An interconnect comprising:

a transmission line;

a waveguide coupled in parallel with the transmission line; and a low pass filter coupled in serial with the transmission line, wherein the serial coupling of the low pass filter and the transmission line is coupled in parallel with the waveguide.

15. The interconnect of claim 14, wherein the interconnect is capable of signal transmission using at least one of binary signaling, frequency modulation, phase modulation, amplitude modulation, or quadrature modulation.

16. The interconnect of claim 14, wherein the interconnect is capable of signal transmission at data rates from direct current up to at least 100 Gb/sec.

17. The interconnect of claim 16, further comprising an adder to combine signals transmitted over the waveguide and signals transmitted over the transmission line.

18. The interconnect of claim 14, wherein the interconnect is one or more of a high speed bus, a memory bus, a graphics bus, a front side bus, an interconnect between two components on a board, an interconnect between a processor and a chip set, an interconnect in a digital system, an interconnect in a computer, an interconnect in a desktop computer, an interconnect in a laptop computer, an interconnect in a server, an interconnect on a printed circuit board, or an interconnect on a motherboard.

19. The interconnect of claim 14, wherein a driver is to provide a signal to be transmitted over the interconnect and a receiver is to receive the signal to be transmitted over the interconnect.

20. The interconnect of claim 14, further comprising an adder to combine signals transmitted over the waveguide and signals transmitted over the transmission line.

21. The interconnect of claim 14, wherein the interconnect is capable of signal transmission using at least one of binary signaling, frequency modulation, phase modulation, amplitude modulation, or quadrature modulation.

22. A system comprising:

a first component;

a second component; and an interconnect comprising:

a transmission line; and a waveguide coupled in parallel with the transmission line;

wherein the first component is a processor and the second component is at least one integrated circuit of a chip set.

23. The system of claim 22, wherein the interconnect is capable of signal transmission at data rates from direct current up to at least 100 Gb/sec.

24. The system of claim 22, wherein the interconnect is one or more of a high speed bus, a memory bus, a graphics bus, a front side bus, an interconnect between two components on a board, an interconnect between a processor and a chip set, an interconnect in a digital system, an interconnect in a computer, an interconnect in a desktop computer, an interconnect in a laptop computer, an interconnect in a server, an interconnect on a printed circuit board, or an interconnect on a motherboard.

25. The system of claim 22, further comprising a driver to provide a signal to be transmitted over the interconnect and a receiver to receive the signal to be transmitted over the interconnect.

26. The system of claim 22, wherein the interconnect is capable of signal transmission using at least one of binary signaling, frequency modulation, phase modulation, amplitude modulation, or quadrature modulation.

27. The system of claim 22, the interconnect further comprising:

a low pass filter coupled in serial with the transmission line, wherein the serial coupling of the low pass filter and the transmission line is coupled in parallel with the waveguide; and an adder to combine signals transmitted over the waveguide and signals transmitted over the transmission line.

28. A system comprising:

a first component;

a second component; and an interconnect comprising:

a transmission line;

a waveguide coupled in parallel with the transmission line; and an adder to combine signals transmitted over the waveguide and signals transmitted over the transmission line.

29. The system of claim 28, wherein the interconnect is capable of signal transmission at data rates from direct current up to at least 100 Gb/sec.

30. The system of claim 28, wherein the interconnect is one or more of a high speed bus, a memory bus, a graphics bus, a front side bus, an interconnect between two components on a board, an interconnect between a processor and a chip set, an interconnect in a digital system, an interconnect in a computer, an interconnect in a desktop computer, an interconnect in a laptop computer, an interconnect in a server, an interconnect on a printed circuit board, or an interconnect on a motherboard.

31. The system of claim 28, further comprising a driver to provide a signal to be transmitted over the interconnect and a receiver to receive the signal to be transmitted over the interconnect.

32. The system of claim 28, wherein the interconnect is capable of signal transmission using at least one of binary signaling, frequency modulation, phase modulation, amplitude modulation, or quadrature modulation.

33. The system of claim 28, the interconnect further comprising a low pass filter coupled in serial with the transmission line, wherein the serial coupling of the low pass filter and the transmission line is coupled in parallel with the waveguide.

34. The system of claim 28, wherein the first component is a processor and the second component is at least one integrated circuit of a chip set.

* * * * *